US008735915B2

(12) United States Patent
Lin et al.

(10) Patent No.: US 8,735,915 B2
(45) Date of Patent: May 27, 2014

(54) LED LIGHTING FIXTURE WITH PHOSPHOR-COATED COVER

(75) Inventors: Chih-Hao Lin, Taipei (TW); Cheng-Wei Hung, Mao-Li County (TW); Kun-Hua Wu, Hsinchu County (TW); Chao-Hsien Wang, Tainan (TW); Po-Chang Chen, Yunlin County (TW); Chih-Ping Lo, Hsinchu County (TW); Po-Chang Chen, Tainan (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 13/479,281

(22) Filed: May 24, 2012

(65) Prior Publication Data

US 2012/0326184 A1 Dec. 27, 2012

(30) Foreign Application Priority Data

Jun. 23, 2011 (TW) ............................ 100122003 A

(51) Int. Cl.
*H01L 29/00* (2006.01)

(52) U.S. Cl.
USPC .................. 257/89; 257/98; 257/99; 257/100

(58) Field of Classification Search
USPC ........... 257/98, 99, 100, 89, E27.12, E33.061
See application file for complete search history.

(56) References Cited

U.S. PATENT DOCUMENTS

| | | | | |
|---|---|---|---|---|
| 4,061,946 | A * | 12/1977 | Schreurs | 313/488 |
| 6,876,143 | B2 * | 4/2005 | Daniels | 313/504 |
| 8,169,131 | B2 * | 5/2012 | Murazaki et al. | 313/486 |
| 2007/0147046 | A1 * | 6/2007 | Arik et al. | 362/294 |
| 2007/0170840 | A1 * | 7/2007 | Chang-Hae et al. | 313/503 |
| 2010/0232133 | A1 * | 9/2010 | Tran et al. | 362/84 |
| 2010/0232134 | A1 * | 9/2010 | Tran | 362/84 |
| 2012/0008647 | A1 * | 1/2012 | Matsuda et al. | 372/5 |
| 2012/0223632 | A1 * | 9/2012 | Hussell et al. | 313/483 |
| 2012/0286665 | A1 * | 11/2012 | Wang et al. | 315/113 |

* cited by examiner

*Primary Examiner* — Bilkis Jahan
(74) *Attorney, Agent, or Firm* — CKC & Partners Co., Ltd.

(57) ABSTRACT

A LED (Light-Emitting Diode) lighting fixture and a manufacturing method thereof are disclosed. The LED lighting fixture comprises a LED module generating light at a wavelength range of 300-700 nm, a lamp cover shielding the LED module, and a phosphor layer. The phosphor layer which is coated on an inner surface towards the LED module comprises at least two types of phosphor mixed at a default ratio for transforming the light of 300-700 nm in wavelength to luminary light in the wavelength range of 400-700 nm.

12 Claims, 8 Drawing Sheets

LED LIGHTING FIXTURE WITH PHOSPHOR-COATED COVER

RELATED APPLICATIONS

The application claims priority to Taiwan Application Serial Number 100122003, filed Jun. 23, 2011, which is herein incorporated by reference.

BACKGROUND

1. Field of Invention

The present invention relates to a LED lighting fixture. More particularly, the present invention relates to an LED (Light Emitting Diode) lighting fixture with a thickness-variable phosphor layer and a manufacturing method thereof.

2. Description of Related Art

An LED (Light Emitting Diode) is a semiconductor element which generates light by releasing the energy via the combination of holes and electrons. That is, to transform electric energy to optical energy. When a voltage is applied between a positive terminals and a negative terminal in a semiconductor, as current flows through to combine electrons with holes, energy will be released out as light. The color of the light depends on the materials. Also, the energy level changes the color of the light. Further, when a positive voltage is applied, the LED can emit single-color light, discontinuous light, which is one of the photo-electric effects. The LED can emit near-ultraviolet light, visible light, or infrared light by changing the chemical composition of the semiconductor. To sum up, the LED is a new economical light source in the 21$^{st}$ century and has advantages of high efficiency and long operation life, in comparison with the conventional light source.

Nowadays, various LED lamps appeared in the lighting market. However, it is still needed to improve the cost performance and enhance the illumination effect.

SUMMARY

Hence, according to an embodiment of the present invention, an LED lighting fixture is provided. The LED lighting fixture comprises an LED module, a lamp cover, and a phosphor layer. The LED module is configured to generate a light source of 300-700 nm in wavelength. The lamp cover is configured to cover/shield the LED module. The phosphor layer is coated on an inner surface of the lamp cover towards the LED module, and is formed by mixing at least two different phosphors with a predetermined ratio, and is configured to transform the light source of 300-700 nm in wavelength to a lighting source of 400-700 nm in wavelength.

In the abovementioned embodiment, the thickness of the phosphor layer is 10-100 μm, and is changed continuously with an angle between the lamp cover and the LED module, wherein the thickness of the phosphor layer is the thickest when the angle is 90 degrees, and the predetermined ratio is 0.5:99.5 between the two types of phosphors. The LED module may comprise a plurality of LEDs and each of the LEDs has a different spectrum, and the maximum diameter of the lamp cover is greater than the maximum width of the LED module, and the lamp cover forms a closed space.

In addition, in another embodiment, a manufacturing method of manufacturing the aforementioned LED lighting fixture is also provided. The manufacturing method comprises a preparing step, a mixing step, an injecting step, a drying step, and an assembling step. The preparing step is utilized for preparing the at least two types of phosphor, water, and a solvent. The mixing step is utilized for mixing and stirring the phosphor, the water and the solvent with a default ratio corresponding to the LED module as to generate a coating material. The injecting step is utilized for injecting the coating material onto the lamp cover by a nozzle so as to form the phosphor layer. The drying step is utilized for heating the lamp cover so as to dry the phosphor layer. The assembling step is utilized for assembling the LED module into the inner space of the lamp cover in order to allow the lamp cover shield the LED module.

In the abovementioned embodiment, a thickness of the phosphor layer is 10-100 μm, the thickness of the phosphor layer is changed continuously with an angle between the lamp cover and the LED module, and the thickness of the phosphor layer is the thickest as the angle is 90 degrees.

Therefore, in view of the LED lighting fixture provided by the present invention, the phosphor layer is coated on the inner surface. The phosphor layer comprises at least two types of phosphor materials with a predetermined ratio, and is configured to transform the light source of 300-700 nm in wavelength to a lighting source of 400-700 nm in wavelength. The phosphor layer can be injected repeatedly to parts of the lamp cover. The advantage of the LED lighting fixture is the use the low-cost light source forming lighting with different color and the variable thickness of the phosphor layer enhancing the illumination angle. Moreover, the adjustment of the composition of the LED module and the lamp cover can also improve the illumination angle so as to generate a great benefit in the LED lighting market.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
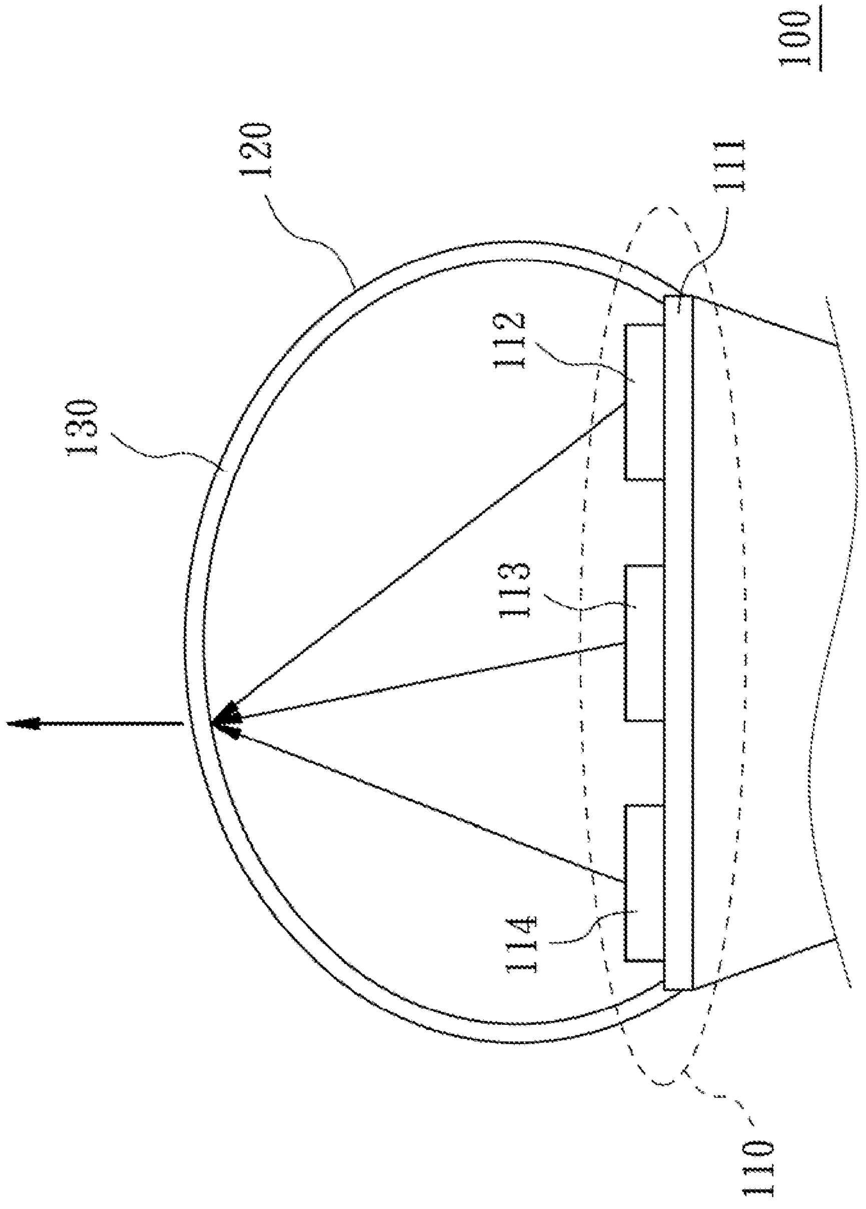
FIG. 1 is a schematic diagram showing an LED lighting fixture in accordance with a first embodiment of the present invention.

Reference will now be made in detail to the present embodiments of the invention, examples of which are illustrated in the accompanying drawings. Wherever possible, the same reference numbers are used in the drawings and the description to refer to the same or like parts.

Referring to FIG. 1, FIG. 1 shows an LED lighting fixture in accordance with a first embodiment of the present invention. An LED lighting fixture 100 comprises an LED module 110, a lamp cover 120, and a phosphor layer 130. The LED module 110 is configured to generate a light source of 300-700 nm in wavelength. The lamp cover 120 is configured to cover/shield the LED module 110. The phosphor layer 130 is coated on a inner surface of the lamp cover 120 towards the LED module 110, and is formed by mixing at least two types of phosphors with a predetermined ratio, and is configured to transform the light source of 300-700 nm in wavelength to a lighting source of 400-700 nm in wavelength.

The lamp cover 120 is utilized to enclose the LED module 110 and it is possible to make a closed space by vacuum or filling in gas or an open space, alternatively. The material of the lamp cover can comprise silicon or plastic, or even Na, K, B, etc. The thickness, size, shape of the lamp cover is adaptive. For example, the shape of the lamp cover may be similar with a circular, an elliptical, a rectangular, a pyramidal, a plate, a tub, a flame, or even a trapezoid. The lamp cover is illustrated as a bulb in this disclosure.

The LED module 110 has many LEDs 112-114, and each of the LEDs 112-114 has different spectrum of emitting light. A heat sink (such as the well-known heat sink fin) is usually attached to the circuit 111 to reduce the influence of thermal decay. However, the base of the bulb, such as the well-known E27, E26, and E17 is not shown in FIG. 1.

The phosphor layer 130 can be made from at least two different types of phosphors with a predetermined ratio, which corresponds with the composition of the LED module 110 (LED 112-114). More specifically, the arrangement of the material or the ratio of the phosphor can change the color/temperature of the light from the LED lighting fixture 100 (for example, the LED bulb in FIG. 1). In FIG. 1, the light emitted by the LED 112-114 excites the phosphor layer 130 coated on the lamp cover 120 so the phosphor layer transforms the light to white for illumination.

Figure 2:
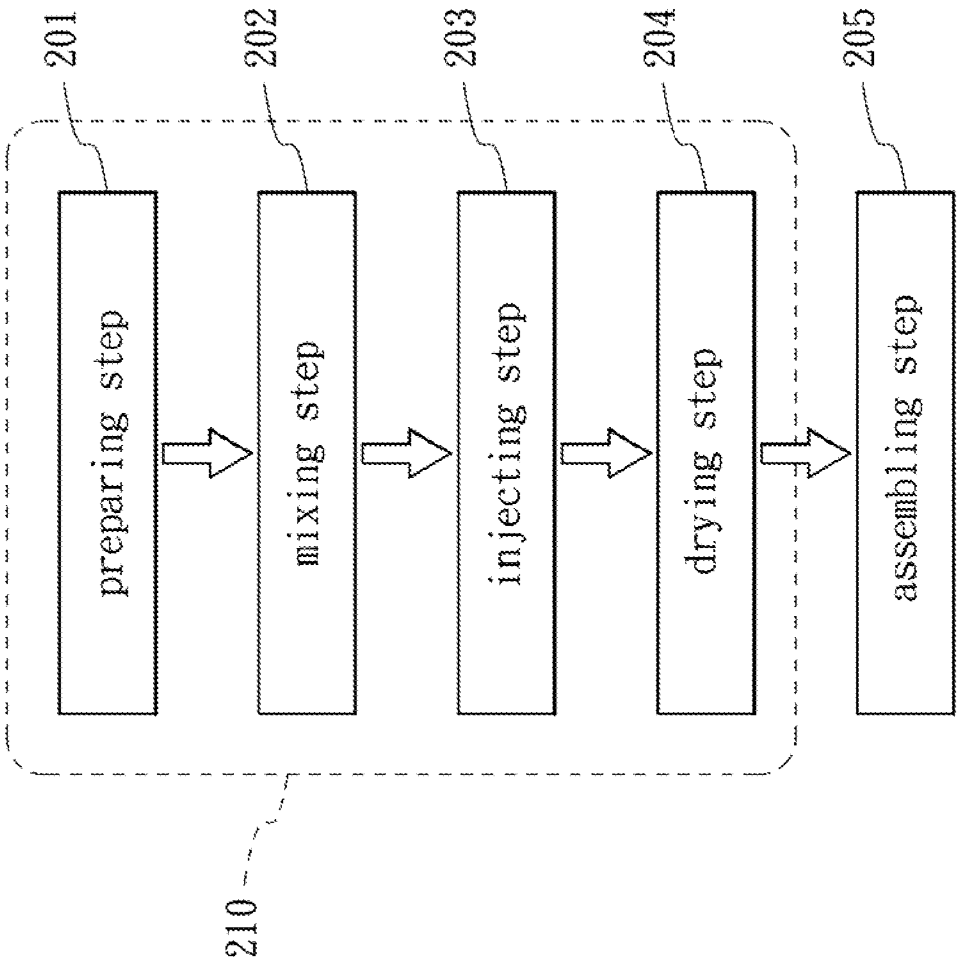
FIG. 2 is a flow chart showing a method of manufacturing a LED lighting fixture in accordance with another embodiment of the present invention.

FIG. 2 shows a flow chart showing a manufacturing method of manufacturing a LED lighting fixture in accordance with another embodiment of the present invention. The manufacturing method comprises a preparing step 201, a mixing step 202, an injecting step 203, a drying step 204, and an assembling step 205. The preparing step 201, the mixing step 202, and the injecting step 203 can be called "coating step 210," which represents the process of coating the phosphor on the lamp cover 120 for forming the phosphor layer 130.

Furthermore, the preparing step 201 is utilized for preparing at least two types of phosphor, water, and a solvent (even other necessary materials). The mixing step 202 is utilized for mixing and stirring the phosphor, the water and the solvent in a default ratio corresponding with the LED module 110 in order to generate a coating material. The injecting step 203 is utilized for injecting the coating material to the lamp cover 120 by a nozzle in order to form a phosphor layer 130. The nozzle injects repeatedly the phosphor to the lamp cover 120 and results in the phosphor layer is with thickness 10-100 μm. The drying step 204 heats the lamp cover 120 to dry and mold the phosphor layer 130 by hot wind or an oven. The assembling step 205 assembles the LED module 110 into the inner space of the lamp cover 120 in order to allow the lamp cover 120 cover/shield the LED module 110. In the manufacturing method, the predetermined ratio of the phosphor layer is 0.5:99.5 between the two types of phosphors and corresponds with the composition of the LED module 110. More specifically, the predetermined ratio can be silicate:CASN=4.5:1, and the color can thus be warm-white. In other words, if the phosphor layer is consisted of two types of phosphor, such as A and B, the predetermined ratio can be A:B=1%:99%, A:B=50%:50%, or A:B=99%:1%, etc, which depends on the requirement.

Figure 3:
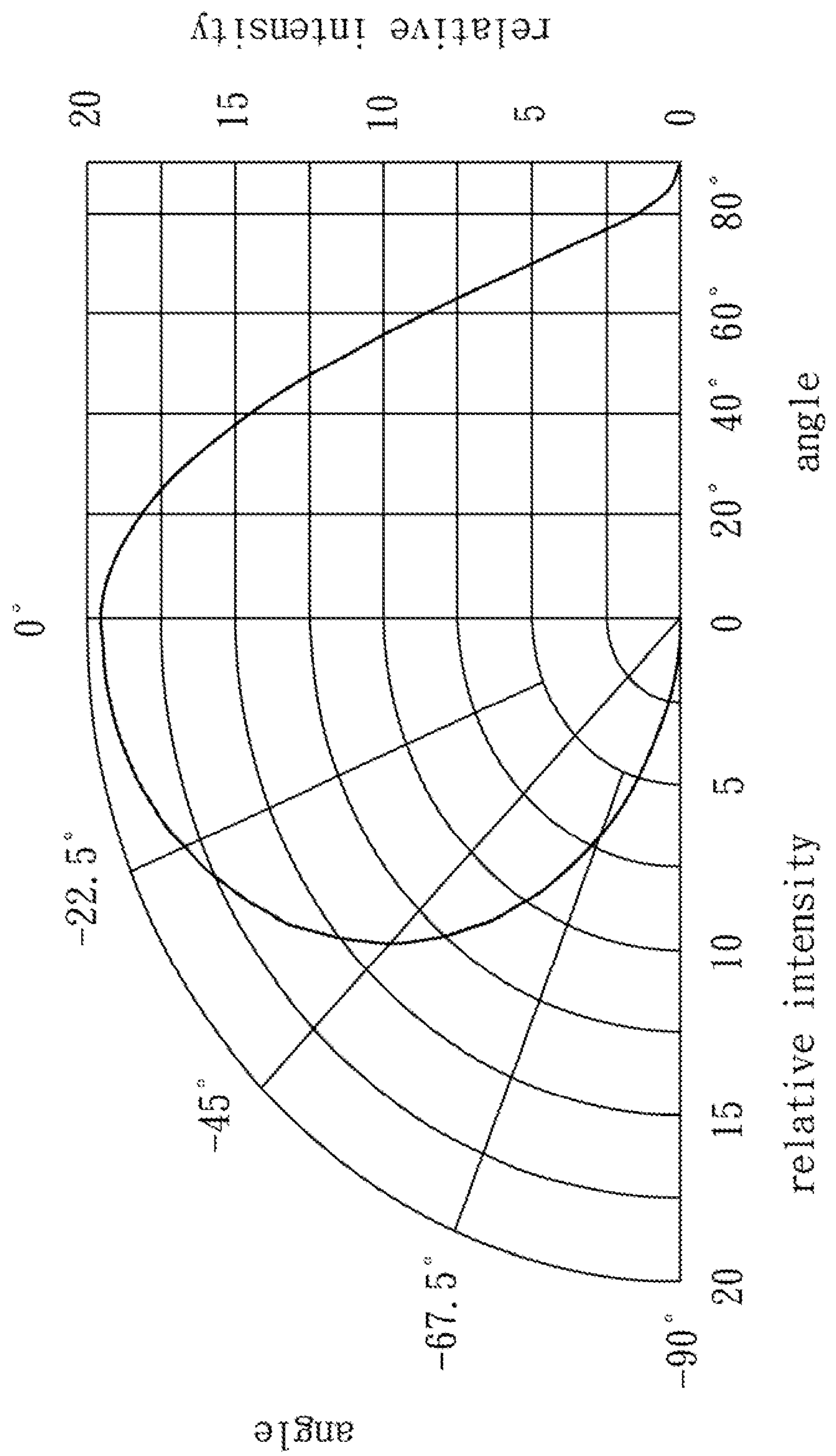
FIG. 3 is a schematic diagram showing the light intensity of the LED.

FIG. 3 shows that the light of LED is directional. The intensity of LED light is the maximum on the top. The intensity of LED light is decaying on the side. That is, the intensity of LED light has maximum at the top and gradually decays on the side. In this regard, the thickness of the phosphor layer 130 is possible to be uniform, or changes continuously with an angle θ between the lamp cover 120 and the LED module 110 in accordance with the embodiment of the present invention, alternatively.

Figure 4:
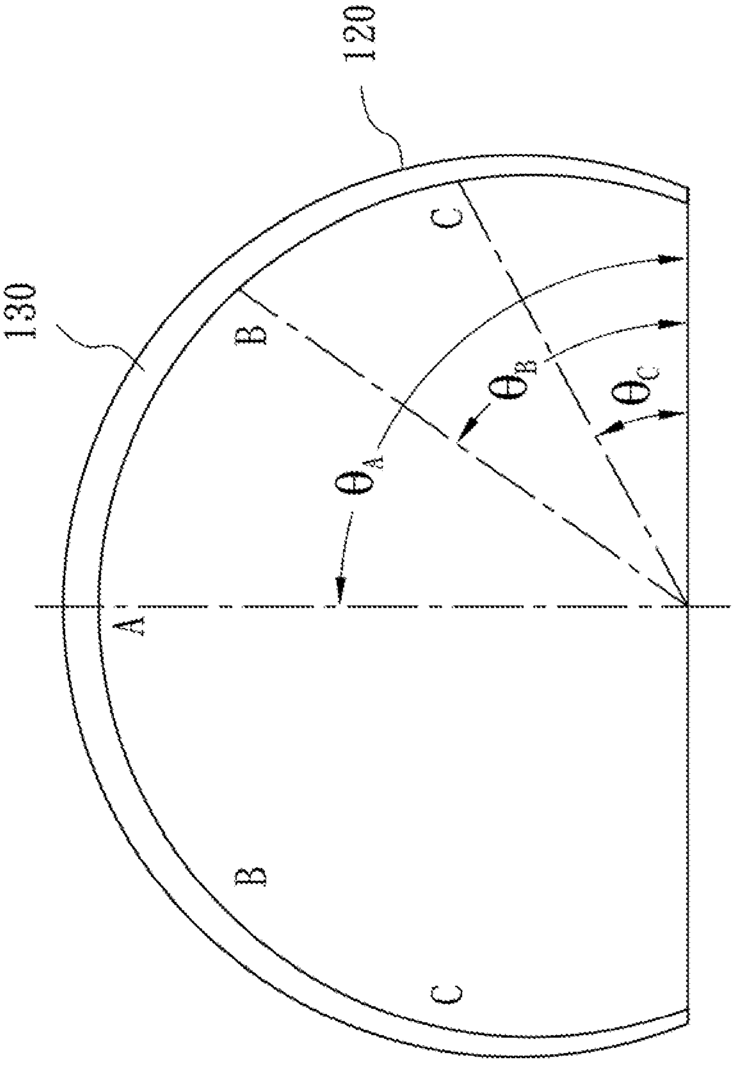
FIG. 4 is a schematic diagram showing the thickness change of a phosphor layer in accordance with the first embodiment of the present invention.

FIG. 4 is a schematic diagram showing the thickness change of the phosphor layer in accordance with the first embodiment of the present invention. in FIG. 4, the lamp cover is divided roughly into three areas, A, B, and C. An angle $\theta_A$=90 degrees is included between a center of area A and the LED module 110 (placed horizontally as shown in FIG. 1). An angle $\theta_B$=45 degrees is included between the center of area B and the LED module 110 (placed horizontally as shown in FIG. 1). An angle $\theta_C$=30 degrees is included between the center of area C and the LED module 110 (placed horizontally as shown in FIG. 1). For example, the phosphor layer 130 at area A can be the thickest. The thickness of the phosphor layer 130 at area B can be 60~100% of area A. The thickness of the phosphor layer 130 at area C can be 30~100% of area A. The adjustment of the thickness of the phosphor layer 130 is achieved by controlling the material of coating, density, rotational speed, winds, temperature, and so on.

Figure 5:
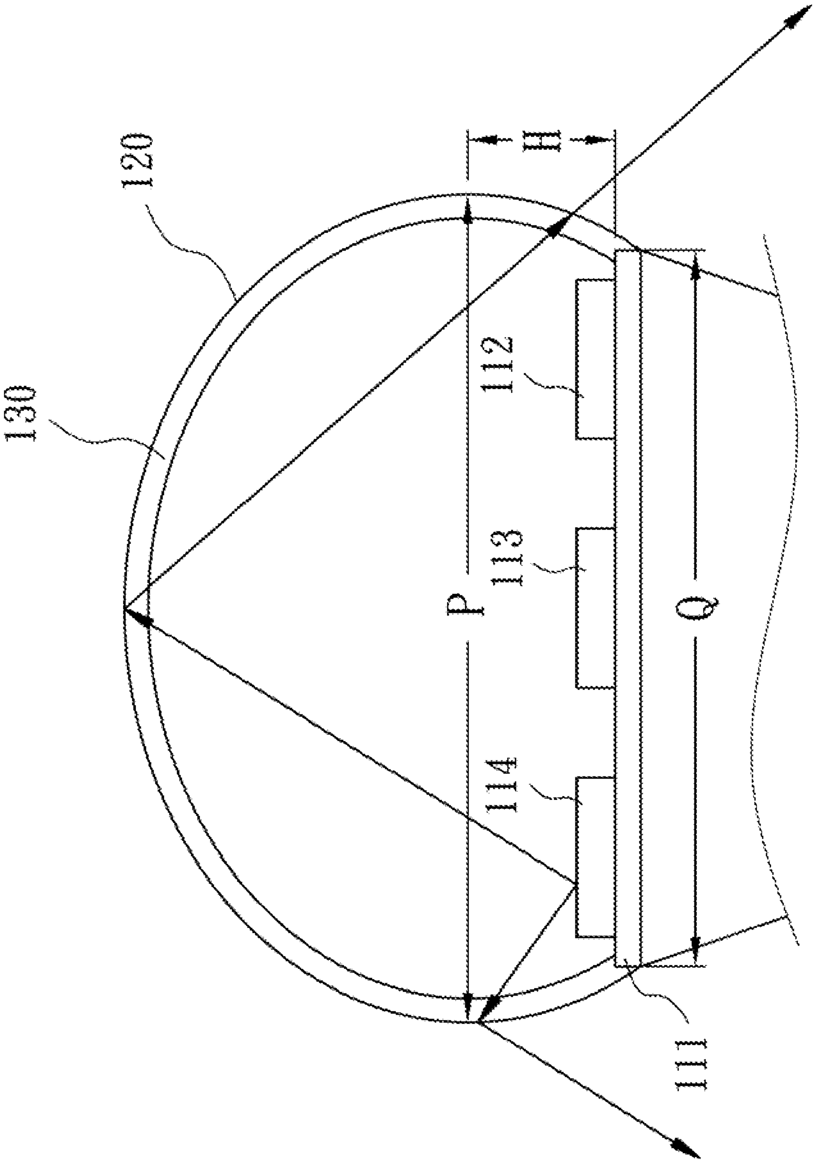
FIG. 5 is a schematic diagram showing an LED lighting fixture in accordance with the second embodiment of the present invention.
Figure 6:
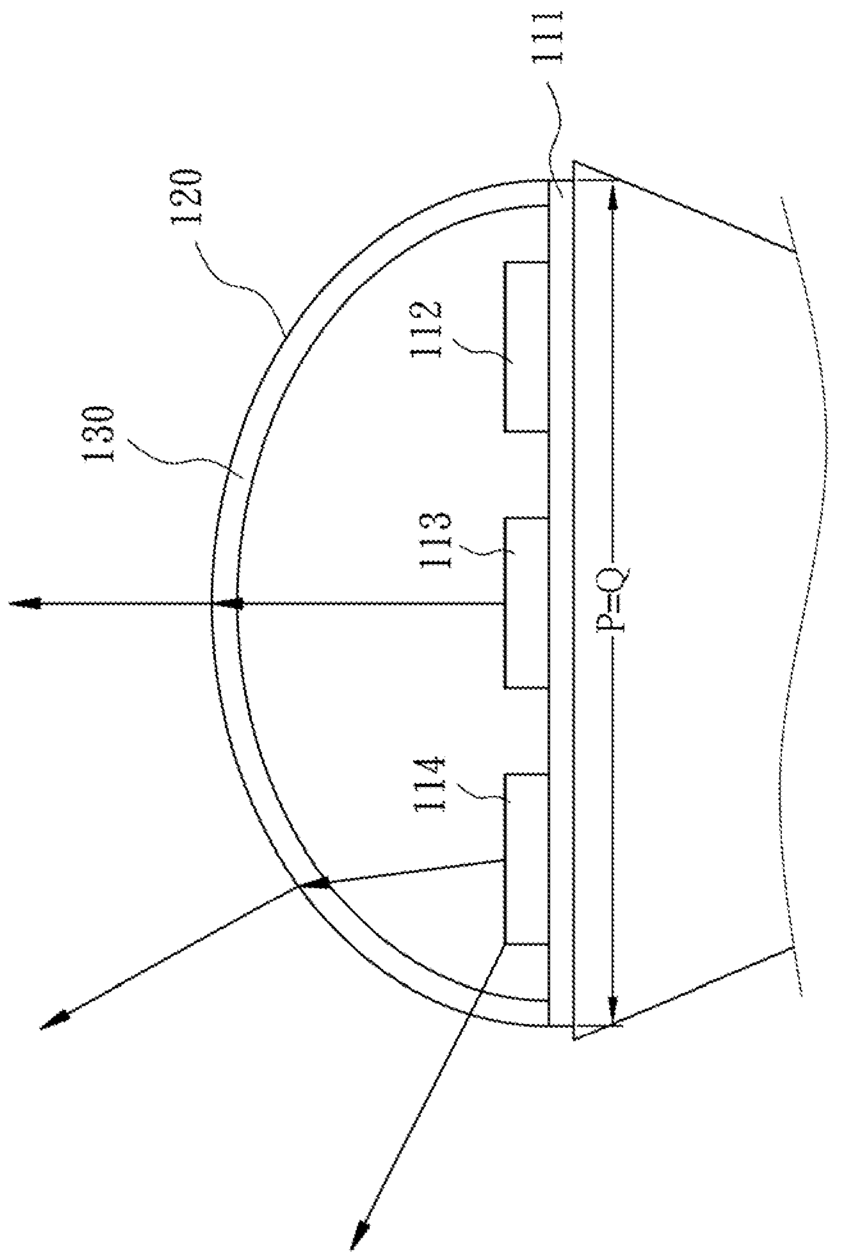
FIG. 6 is a schematic diagram showing an LED lighting fixture in accordance with the third embodiment of the present invention.

FIG. 5 is a schematic diagram showing an LED lighting fixture in accordance with a second embodiment of the present invention. According to the second embodiment, the lamp cover 120 is a hemisphere and has a maximum diameter P, and the circuit board 111 of the LED module 110 is a circle corresponding with the lamp cover 120 and has a diameter Q, and H is the distance between P and Q. For an example of a maximum illumination angle, the luminous flux is 700 lm as P=62.5 mm, Q=56 mm, and H=15 mm. FIG. 6 is a schematic diagram showing an LED lighting fixture in accordance with the third embodiment of the present invention. According to the third embodiment, the lamp cover 120 is a hemisphere and has a maximum diameter P, and the circuit board 111 of the LED module 110 is a circle corresponding with the lamp cover 120 and has a diameter Q, and H is the distance between P and Q. For an example of a maximum illumination angle, the luminous flux is 520 lm as P=Q=62.5 mm, and H=0 mm.

Figure 7:
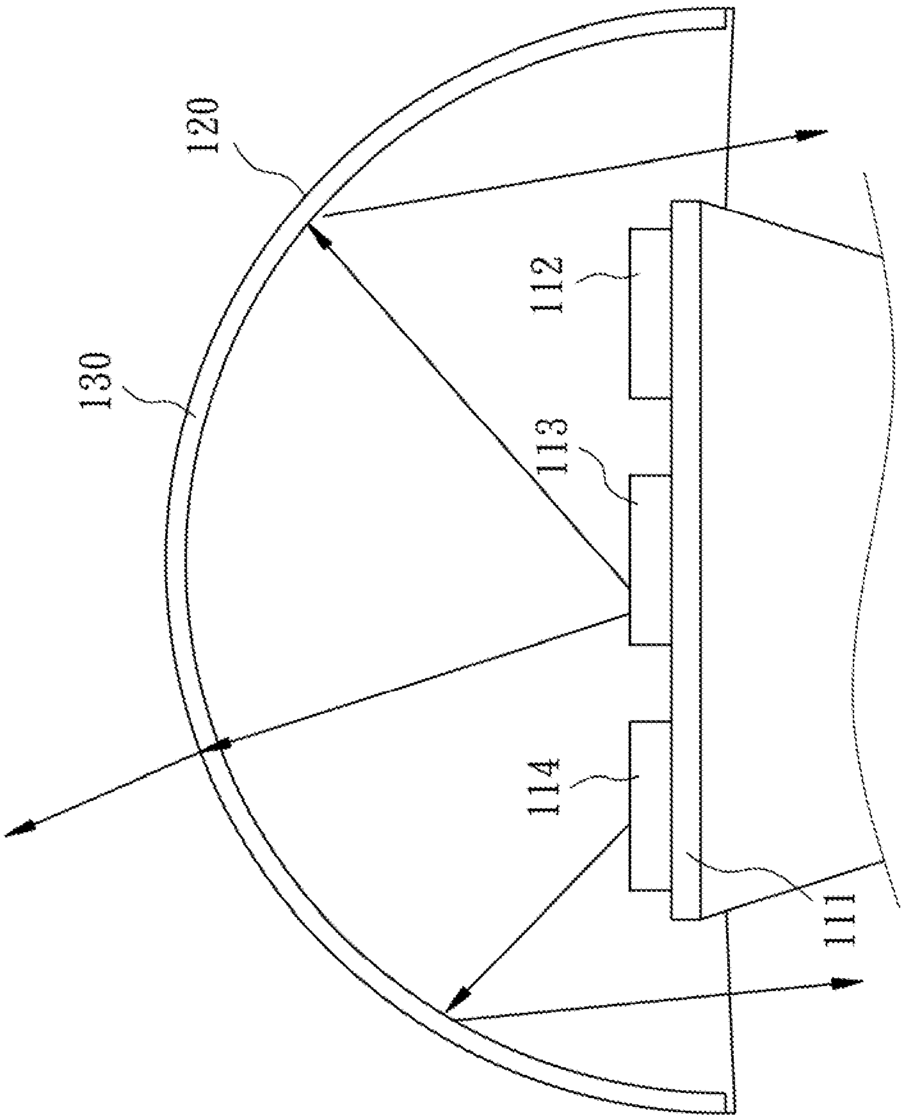
FIG. 7 is a schematic diagram showing an LED lighting fixture in accordance with the fourth embodiment of the present invention.

FIG. 7 is a schematic diagram showing an LED lighting fixture in accordance with the fourth embodiment of the present invention. According to the fourth embodiment, the lamp cover 120 is a hemisphere and has a maximum diameter P, and the circuit board 111 of the LED module 110 is a circle corresponding to the lamp cover 120 and has a diameter Q, and H is the distance between P and Q. When P>Q and H=0 mm, the illumination angle is enlarged due to the unabsorbed light reflected by the uncoated area of the lamp cover.

Figure 8:
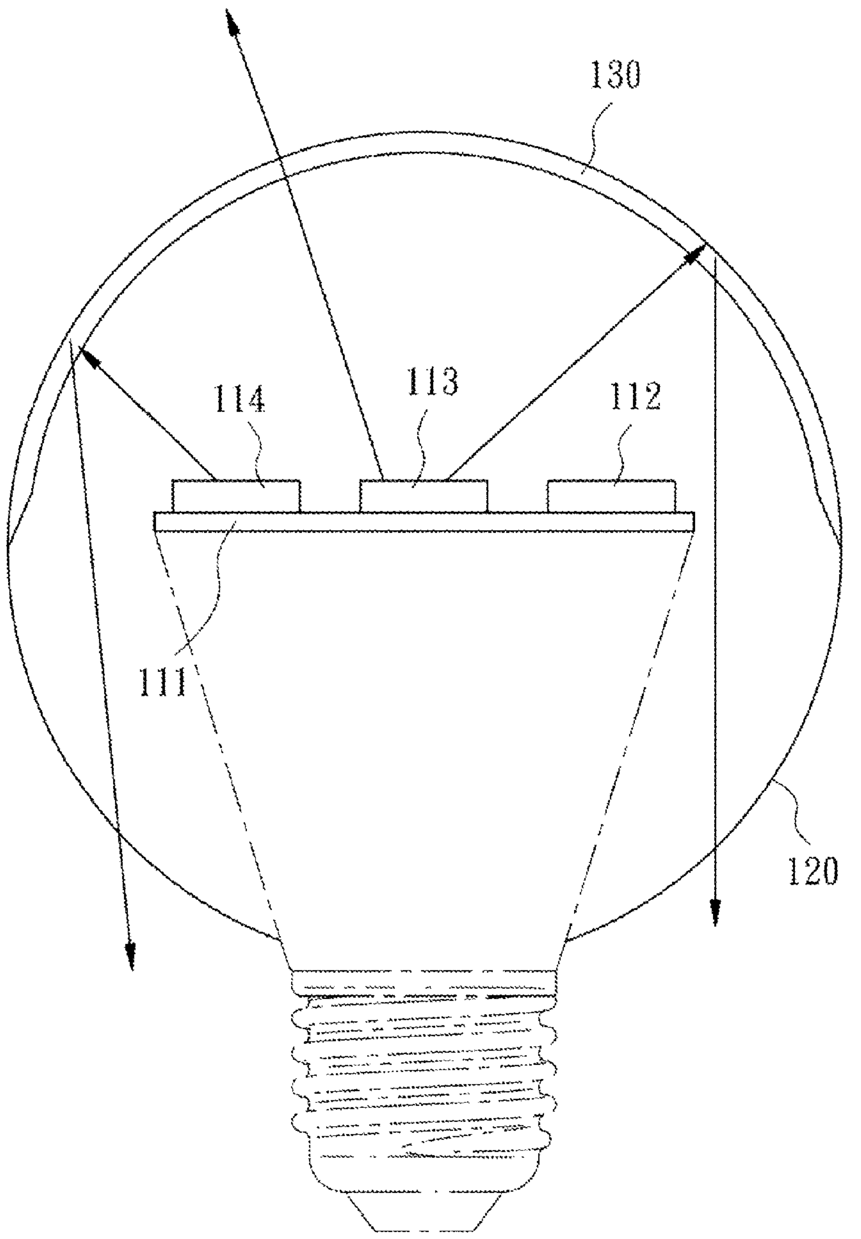
FIG. 8 is a schematic diagram showing an LED lighting fixture in accordance with the fifth embodiment of the present invention.

Similarly, FIG. 8 is a schematic diagram showing an LED lighting fixture in accordance with a fifth embodiment of the present invention. When the lamp cover 120 is a sphere, the phosphor layer 130 is coated on a portion of the lamp cover 120. The uncoated portion of the lamp cover reflects the light to the coated part of the lamp cover so as to improve the illumination efficiency.

Given in the above, in view of the LED lighting fixture of the present invention, the phosphor layer can be injected repeatedly to (parts of) the inner surface of the lamp cover (The inner surface faces towards the LED module 110). The phosphor layer 130 comprises at least two types of fluorescent materials with a predetermined ratio and transforms the light of 300~700 nm in wavelength to the illumination light of 400-700 nm in wavelength. By changing the predetermined ratio or any other properties of the phosphor layer, the color of the light generated from the LED lighting fixture is well processed to be luminary light.

Although the present invention has been described in considerable detail with reference to certain embodiments thereof, other embodiments are possible. Therefore, the spirit and scope of the appended claims should not be limited to the description of the embodiments contained herein.

What is claimed is:

1. A LED (Light-Emitting Diode) lighting fixture, comprising:

a LED module configured to generate a light source of 300-700 nm;

a lamp cover configured to shield the LED module; and a phosphor layer which is coated on an inner surface of the lamp cover towards the LED module, and is formed by mixing at least two types of phosphors with a predetermined ratio, and is configured to transform the light source of 300-700 nm in wavelength to a lighting source of 400-700 nm in wavelength;

wherein a thickness of the phosphor layer is changed continuously in accordance with an angle between the lamp cover and the LED module.

2. The LED lighting fixture of claim 1, wherein a thickness of the phosphor layer is 10-100 μm.

3. The LED lighting fixture of claim 1, wherein the phosphor layer is the thickest as the angle is 90 degrees.

4. The LED lighting fixture of claim 1, wherein the predetermined ratio is 0.5:99.5 between the two types of phosphors.

5. The LED lighting fixture of claim 1, wherein the LED module comprises a plurality of LEDs (Light-Emitting Diodes) and each of the LEDs has a different spectrum.

6. The LED lighting fixture of claim 1, wherein the maximum length of the lamp cover is greater than a width of LED module.

7. The LED lighting fixture of claim 6, wherein the lamp cover forms a closed space.

8. A LED (Light-Emitting Diode) lighting fixture, comprising:

a LED module configured to generate a light source of 300-700 nm;

a lamp cover configured to shield the LED module; and a phosphor layer which is coated on an inner surface of the lamp cover towards the LED module, and is formed by mixing at least two types of phosphors with a predetermined ratio, and is configured to transform the light source of 300-700 nm in wavelength to a lighting source of 400-700 nm in wavelength;

wherein the predetermined ratio is 05:99.5 between the two types of phosphor;

wherein a thickness of the phosphor layer is changed continuously in accordance with an angle between the lamp cover and the LED module;

wherein the phosphor layer is the thickest as the angle is 90 degrees.

9. The LED lighting fixture of claim 8, wherein a thickness of the phosphor layer is 10-100 μm.

10. The LED lighting fixture of claim 8, wherein the LED module comprises a plurality of LEDs (Light-Emitting Diodes) and each of the LEDs has a different spectrum.

11. The LED lighting fixture of claim 8, wherein the maximum length of the lamp cover is greater than a width of the LED module.

12. The LED lighting fixture of claim 11, wherein the lamp cover forms a closed space.

* * * * *